United States Patent [19]

Long et al.

[11] Patent Number: 5,023,202

[45] Date of Patent: Jun. 11, 1991

[54] RIGID STRIP CARRIER FOR INTEGRATED CIRCUITS

[75] Inventors: Jon M. Long, Livermore; Michael J. Steidl, San Jose, both of Calif.

[73] Assignee: LSI Logic Corporation, Milpitas, Calif.

[21] Appl. No.: 380,174

[22] Filed: Jul. 14, 1989

[51] Int. Cl.$^5$ .................... H01L 21/56; H01L 21/60; H01L 21/78

[52] U.S. Cl. .................... 437/206; 437/207; 437/217; 437/220; 357/72; 357/80

[58] Field of Search .............. 437/222, 205, 206, 207, 437/217, 220, 224, 211; 357/70, 71, 72; 361/404, 408, 421, 420, 406, 407; 174/52.1, 52.5; 29/827, 832, 841, 831, 729; 206/328, 330; 264/241, 257, 272.11, 272.17; 228/44.7, 106, 180.2

[56] References Cited

U.S. PATENT DOCUMENTS

| | | | |
|---|---|---|---|
| 3,778,887 | 12/1973 | Suzuki et al. | 357/70 |
| 4,209,355 | 6/1980 | Burns | 357/70 |
| 4,411,719 | 8/1983 | Lindberg | 437/206 |
| 4,835,120 | 5/1989 | Mallik et al. | 437/224 |
| 4,837,184 | 6/1989 | Lin et al. | 437/217 |

FOREIGN PATENT DOCUMENTS 60-160625  8/1985  Japan .................... 437/206

OTHER PUBLICATIONS

IBM Technical Disclosure Bulletin, vol. 32, No. 1, Jun. 89.

*Primary Examiner*—Olik Chaudhuri
*Assistant Examiner*—David E. Graybill
*Attorney, Agent, or Firm*—Skjerven, Morrill, MacPherson, Franklin & Friel

[57] ABSTRACT

An improved method to assemble tape packaged integrated circuits includes spot welding a strip of TAB tape to a thin strip of copper called a strip carrier. The strip carrier provides mechanical rigidity to the tape during later processing, including die attachment and lead bonding and solder plating, as well as providing ESD protection since each tape lead is shorted to the strip carrier. The packaged die and the surrounding tape are excised from the strip carrier prior to final testing and the strip carrier is capable of being reused. The strip carriers are of a size and shape to be readily handled by existing integrated circuit handling equipment.

28 Claims, 5 Drawing Sheets

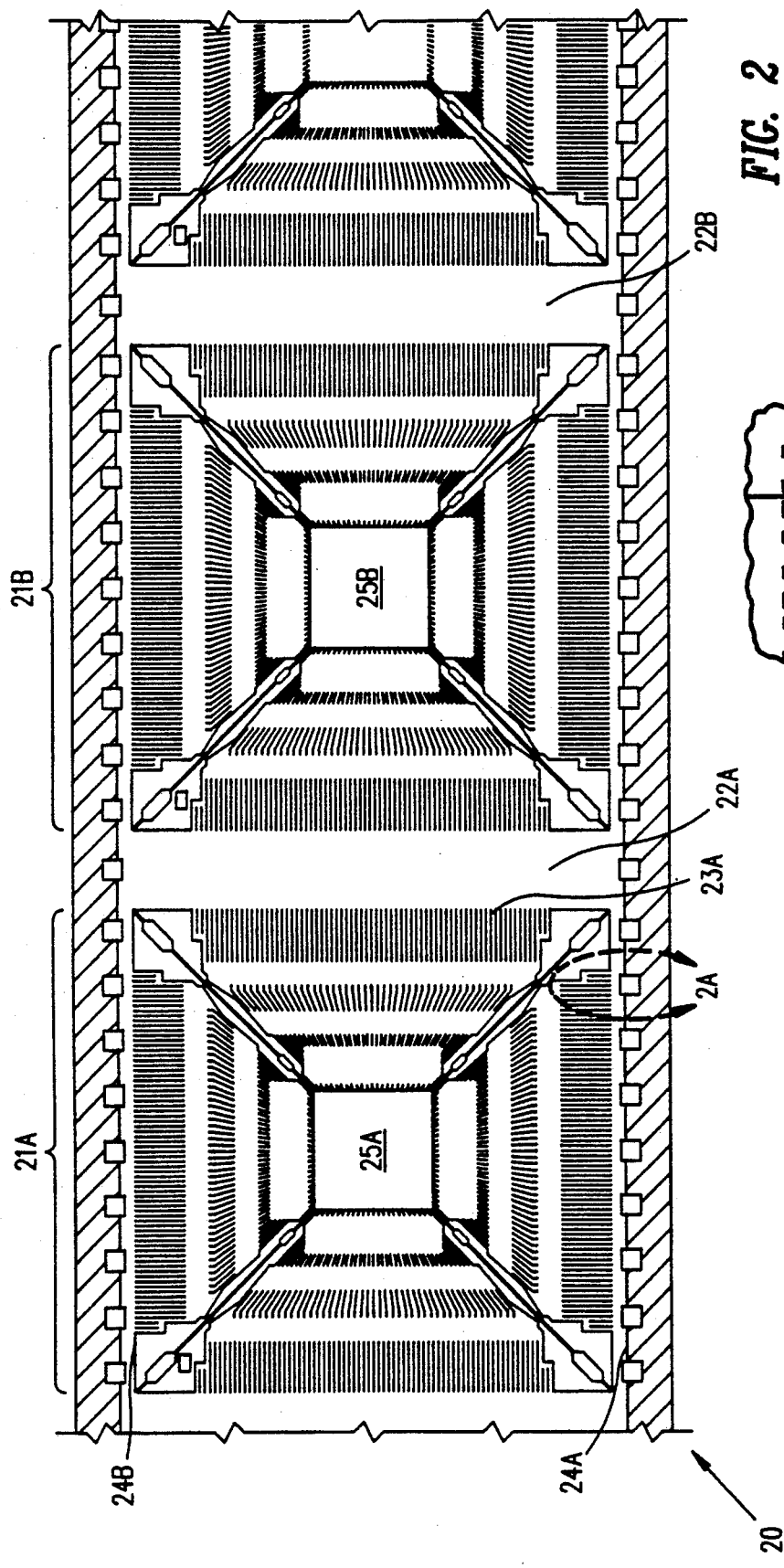
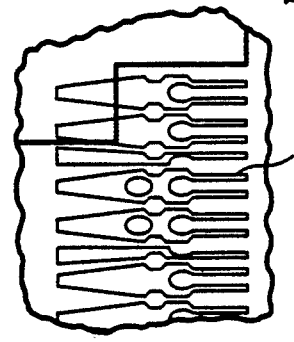
FIG. 2
FIG. 2A

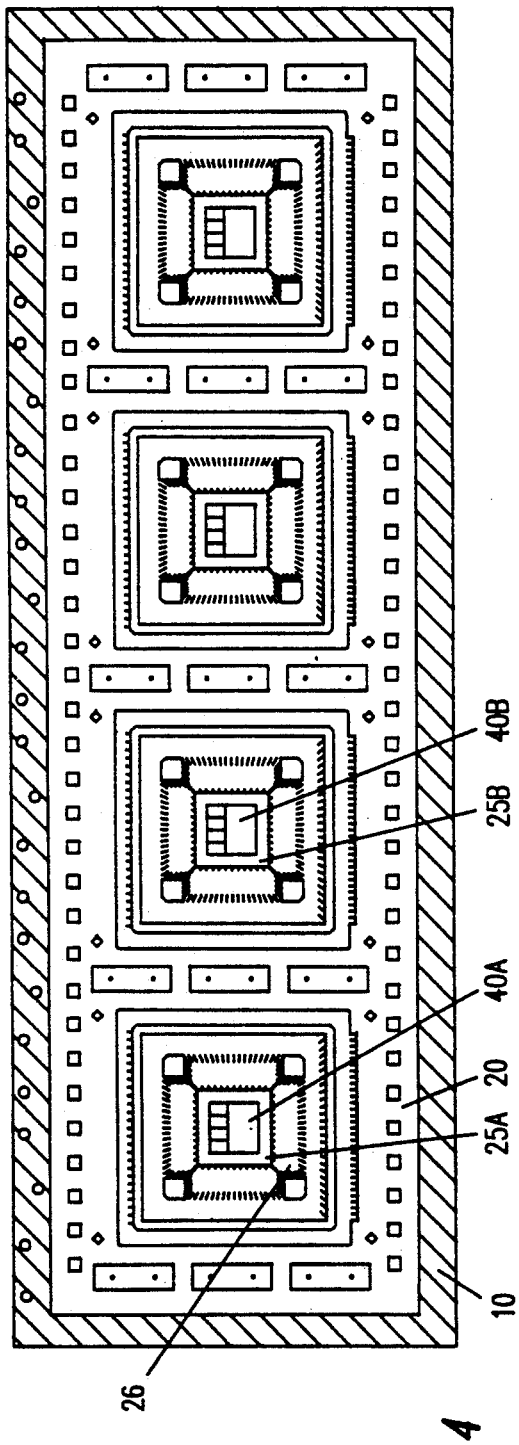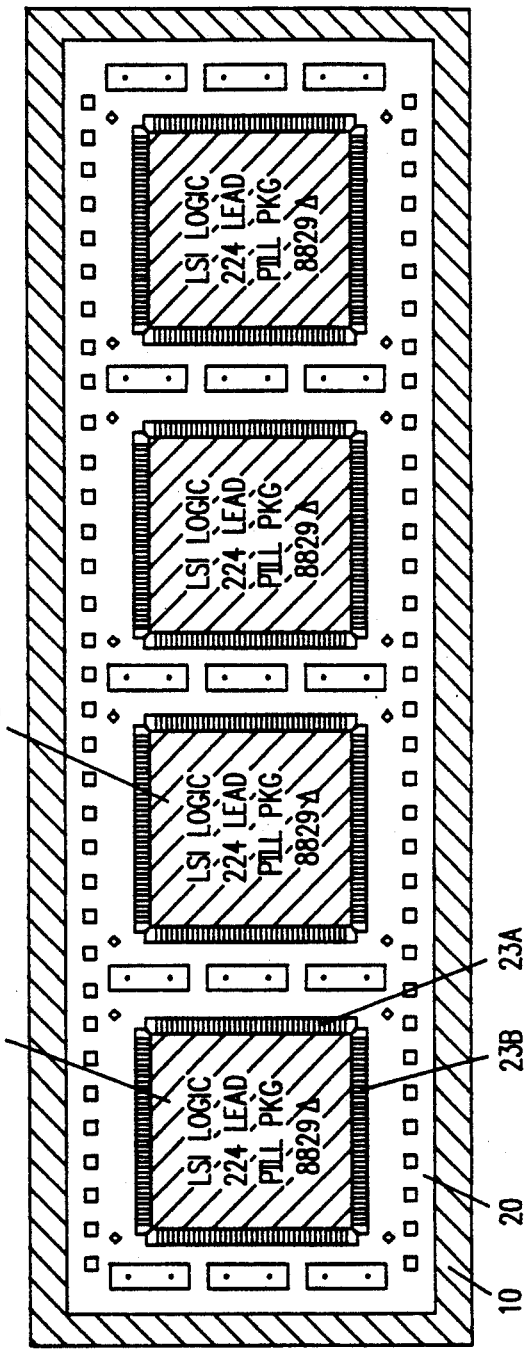
FIG. 4
FIG. 5

RIGID STRIP CARRIER FOR INTEGRATED CIRCUITS

BACKGROUND OF THE INVENTION

1. Field of the Invention

This invention relates to the field of integrated circuit packaging, and especially to a method and device for manufacturing tape packaged integrated circuits.

2. Description of the Prior Art

Tape automated bonding (TAB) is a well known method of attaching integrated circuit die to their electrical leads. TAB involves attaching (typically with epoxy adhesive) the individual die to a strip of Kapton flexible tape having copper traces (usually gold plated or solder plated) formed on the tape. The bond pads on the die are bonded to the copper traces, either directly (referred to as B-TAB) or by using gold bumps on the bond pad (TAB). The die is then encapsulated (i.e., packaged), then excised (i.e., cut) from the tape, with the traces on the tape serving as the leads for later electrical interconnection by the user of the integrated circuit. Thus there are no rigid metal leads provided at all, unlike the typical DIP package.

The tape is typically 5 mil (0.13 mm.) thick Kapton with 1.5 mil (0.004 mm.) thick copper traces on it. The tape is very flexible, with no structural strength. The tape is typically provided on a reel, and takes a "set", (i.e., a curl) from being on the reel, making it difficult to flatten the tape to properly bond the die. Thus it is easy to crack the die or have the die "pop off" due to the curl.

For simple integrated circuits having low lead counts, such as twenty or fewer leads, the tape is handled in reel-to-reel fashion with the die attached during later processing. Such an approach is not feasible for larger more complex die with more leads, since the tape cannot be held flat and straight enough using known methods.

Thus, for high lead count die, the prior art typically cuts the Kapton tape into short strips, each strip long enough to accommodate only three or four die.

An alternative prior art method involves cutting the tape into very short strips, each long enough for only one die, and putting the short strip of tape in a single slide carrier, which is a small plastic frame for further handling (i.e., bonding the tape to the die). A major problem with this approach is that the plastic frame is not conductive, so the leads on the tape which are already bonded to the die are not shorted together, causing an ESD (electrostatic discharge) problem which means that static electricity can easily damage the die.

The slide carriers have a further disadvantage that the leads must be plated in a solder electroplating bath so as to be solderable by che user, but the plastic slide carriers are softened and thus damaged by exposure to the electroplating bath.

Another deficiency of the prior art is that, as described above, the tape is supplied with its traces usually either solder plated or gold plated. Gold plated leads are typically used for wire bonding, or for thermal compression bonding. Solder (i.e., tin and lead) plated leads are typically used for a gold-eutectic bond to the die. If there is any gold on the solder-plated type tape, gold embrittlement undesirably occurs in the solder, and the thermal cycling in later processing causes bonding failures due to the embrittlement.

In conventional TAB bonding, as used for low lead count packages with relatively simple IC's, the inner ends of the copper traces on the tape are bonded directly to gold plated "bumps" on the die at each die bond pad. The copper traces are bonded to the bumps by thermocompression or gold-tin (i.e., solder) eutectic methods. The gold plating on the copper traces enhances the bond to the gold plated bumps on the die.

Another known bonding method for VLSI purposes (i.e., high lead count packages) uses the same kind of tape as described above, but attaches the die connect pads not directly to the copper traces, but instead by means of wire bonds. In this method very short wires of aluminum or gold are attached at one end to the connect pads on the die and at their other end to the inner ends of the copper traces on the tape. The wires are attached usually by thermocompression bonding, ultrasonic bonding, or thermosonic bonding.

Also well known in the art are lead frames. Lead frames are sacrificial metal members which hold metal leads in position during the encapsulation phase of semiconductor packaging. The lead frames are cut away and discarded after packaging is completed, but serve to enhance handling during packaging. Lead frames are not conventionally used in conjunction with tape packaging, since the tape itself serves the purpose of holding the traces in position.

SUMMARY OF THE INVENTION

The present invention in its preferred embodiment is an improved process for tape packaging semiconductor die. The improved process uses a metal strip called a strip carrier made of material similar to a lead frame to provide both mechanical support and electrical ground to the die-tape assembly during the processing.

The process in accordance with the preferred embodiment of the present invention includes these steps:

1. Providing a strip of TAB tape about 8 inches long, with space for typically 4 to 6 die, and spot welding specially provided copper areas on the tape to a strip carrier. The strip carrier is preferably a rectangle of thin copper slightly longer and wider than the tape, and includes several rectangular cut-outs (one cut-out for each die).

2. In the wire bonding embodiment of the invention, using conventional means, such as epoxy adhesive, to attach the die to the tape that has already been spot welded to the strip carrier.

3. Placing the entire assembly in an oven to cure the epoxy adhesive used to attach the die to the tape.

4. Wire bonding the die bond pads to the traces on the tape for each die, using conventional wire bonding means.

5. Assembling a package (i.e., a housing) on the tape for each die, and curing the plastic package.

6. Plating solder onto the tape traces by placing the entire assembly in a solder electro-plating bath.

7. Excising each packaged die from the strip carrier.

8. Testing each packaged die by conventional means.

Alternatively, in the conventional TAB assembly embodiment, steps 2, 3 and 4 above are omitted and replaced by bonding the tape traces to gold bumps covering the bond pads on the die. Then the process continues with step 5 above.

This invention has the following advantages over the prior art:

a. It lends itself better to automation, since the strip carriers makes the tape strips rigid so they can be easily handled by automated machinery and moved in and out of conventional magazines.

b. The strip carrier lends itself to handling with existing equipment, as is now used to handle lead frames.

c. The strip carrier is conductive, and each trace on the tape is in electrical contact with the strip carrier. Thus each die lead is shorted to the strip carrier, preventing static damage to the die.

d. There is no need to handle tape with die attached on reels; instead the shorter, and so more convenient, strips are handled.

e. Since the strip carrier is metal, it is not harmed by immersion in the solder plating bath.

f. Being a thin strip of metal, the strip carrier desirably retains its flatness through the temperature cycles of the processing steps.

g. The strip carrier is reusable, and hence low cost.

BRIEF DESCRIPTION OF THE FIGURES

FIG. 2 shows a strip of tape as used in one embodiment of the present invention.

FIG. 4 shows the tape with die attached in accordance with the present invention.

FIG. 5 shows packaged die on the tape in accordance with the present invention.

Identical reference numerals in the various Figures refer to similar or identical structures.

DETAILED DESCRIPTION OF THE INVENTION

Figures 1, 7:
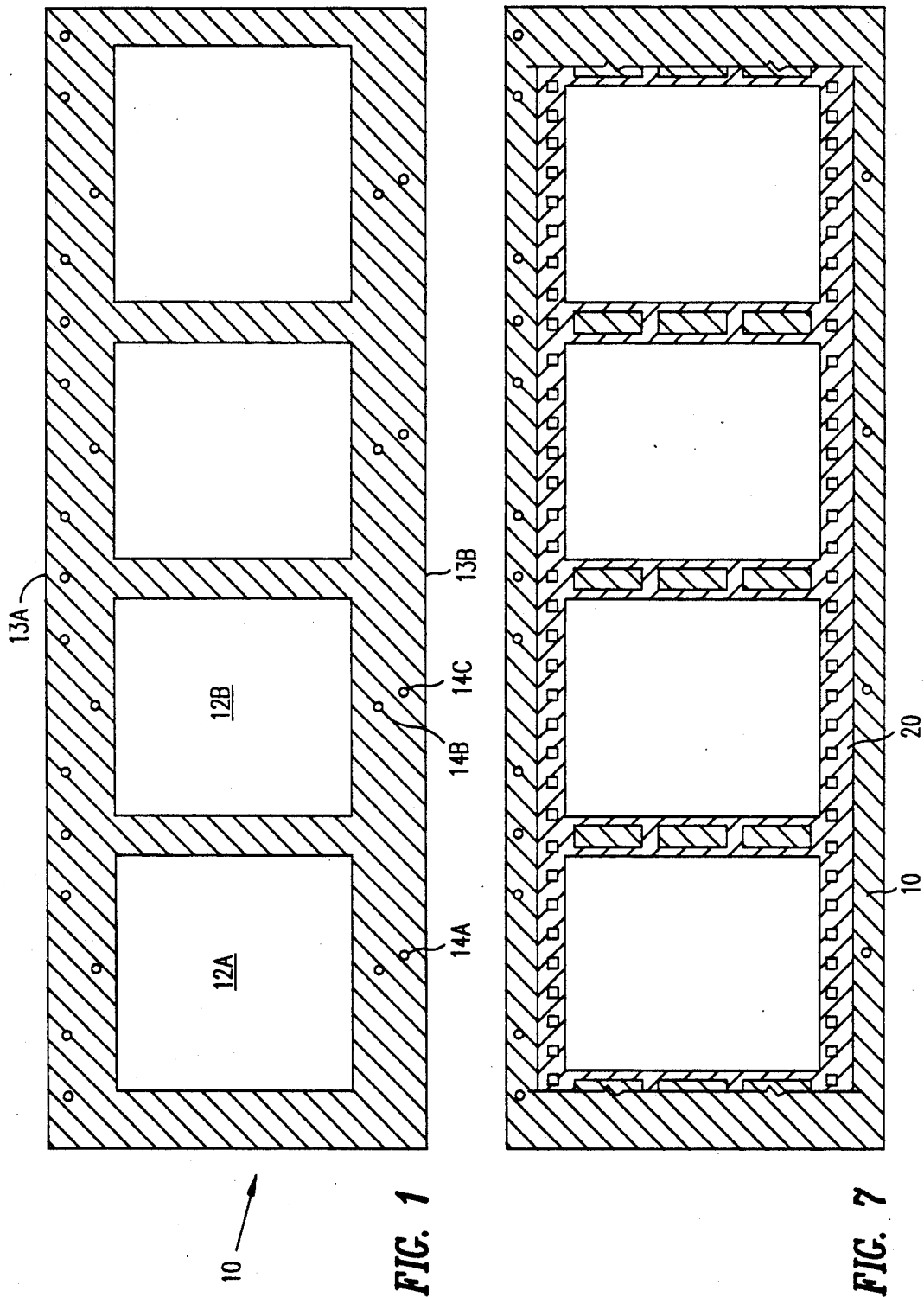
FIG. 1 shows a strip carrier as used in one embodiment of the present invention.
FIG. 7 shows the strip carrier after the packaged die have been excised.

The strip carrier in the preferred embodiment of the present invention is a strip 10 as shown in FIG. 1 typically (but not necessarily) about seven to nine inches long (18 to 23 cm) which is the length conveniently held in a conventional lead frame magazine, and typically about 60 mm wide, so as to be slightly wider than a typical 48 mm wide TAB tape. The width could be alternatively slightly (about 10 mm) wider than a 35 mm or 70 mm or 105 mm wide TAB tape, or be any other convenient width. The dimensions are not a critical element of the invention.

The strip carrier 10 is made of a conductive material, typically metal and preferably copper, preferably about six to 15 mils thick 0.15 mm to 0.38 mm). The thickness is enough to provide food mechanical rigidity.

In the preferred embodiment the strip carrier has several rectangular cut-outs 12A, 12B, etc., each a convenient size such as about 1½ inches by 1½ inches (3.8 cm by 3.8 cm) to allow the packaged die to be excised as described below.

The preferred embodiment has four to six cut out areas 12A, 12B, etc. (four are shown in FIG. 1) to accommodate an equivalent number of die.

The side pieces 13A, 13B of the strip carrier extend beyond the cut out areas 12A, 12B, etc. and are wide enough to permit room for clamping of the strip carrier 10 along the side pieces while handling, and to permit later excising of the tape without the cutting blade coming into contact with the strip carrier 10 itself.

The strip carrier 10 preferably has holes 14A, 14B, 14C, etc. in the side pieces 13A, 13B. The holes 14A, 14B, 14C, etc. are placed variously for alignment with various fixtures used in processing and for handling by automated equipment. The pattern of holes depends on the fixtures and equipment to be used.

In the first step of the process in accordance with the present invention, a strip of TAB tape is spot welded to the above-described strip carrier. The TAB tape 20 (a strip of which is shown in FIG. 2) is similar to that used in the prior art, having a repetitive pattern 21A, 21B, etc. of copper traces (also called leads) imprinted on polymide tape backing, except that unlike the prior art, between each pattern 21A, 21B, etc. of traces there is provided a broad additional stripe 22A, 22B of copper, extending preferably the width of the patterns 21A, 22B and extending through the tape's thickness. These broad stripes 22A, 22B are provided by the tape manufacturer when the trace patterns 21A, 21B are imprinted on the tape 20.

The copper pattern 21A, 21B on the TAB tape 20 also differs from that of the prior art in that each trace 23A, 23B, etc. is electrically shorted (i.e., connected) to the strip carrier (not shown) when the tape 20 is spot welded to the strip carrier. The electrical shorting is accomplished by patterning the traces 23A, 23B, etc. on the tape 20 so that each trace 23A, 23B, etc. is in contact with one of the broad copper stripes 22A on the tape 20 either directly or by means of narrower side stripes 24A, 24B which also contact broad stripes 22A, 22B. The narrower side strips 24A, 24B need not extend through the tape 20. This electrical shorting provides ESD protection to the die which is to be attached to tape 20. The copper pattern on the tape 20 is conventionally gold plated or solder plated. Tape 20 includes die areas 25A, 25B, etc.

Figure 3:
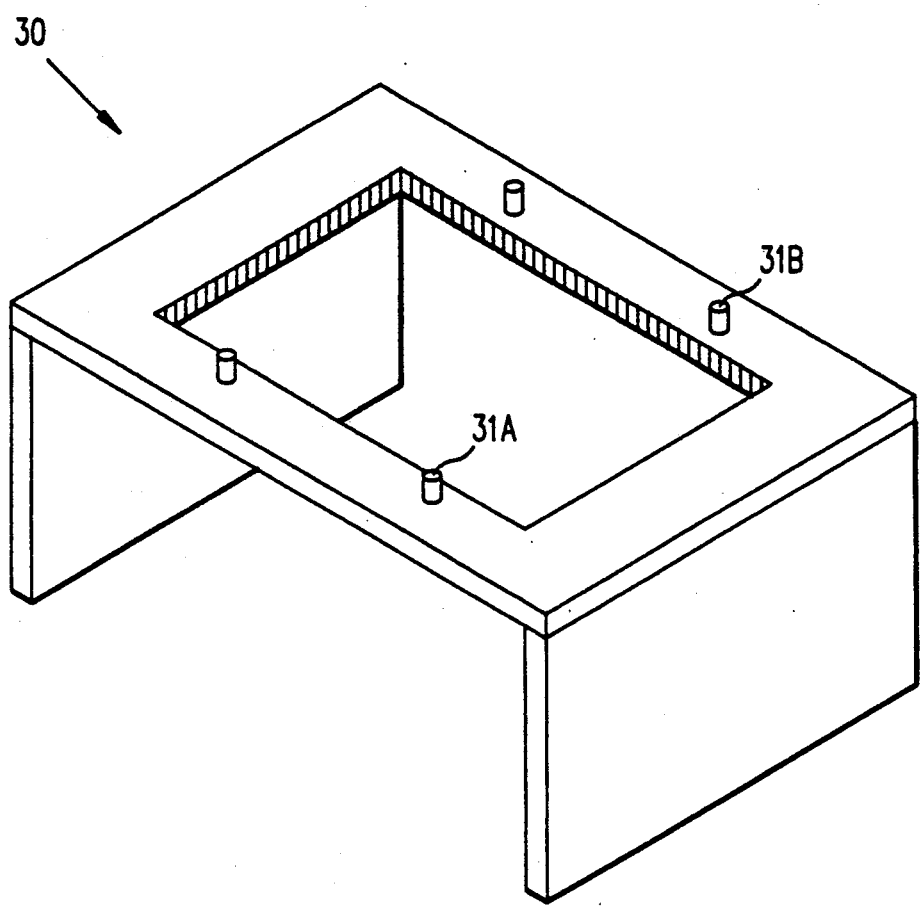
FIG. 3 shows a spot welding fixture in accordance with the present invention.

In the spot welding process, a strip of tape slightly shorter than the strip carrier is placed on top of the strip carrier. The strip carrier is preferably held in a fixture 30, (see FIG. 3) which has several locator pins 31A, 31B, etc. on its edges. These pins 31A, 31B, etc. fit into alignment holes on the side pieces of the strip carrier as seen in FIG. 1. Then a spot welder as conventionally used in semiconductor manufacturing for welding lead frames, is applied to the broad copper stripes 22A, 22B, etc. (see FIG. 2) on the tape 20, so the heat from the welder welds the broad copper stripe areas to the copper strip carrier.

Note that the copper tape could have fewer broad stripes 22A, 22B than shown in FIG. 2, so long as the tape is firmly fixed to the strip carrier by the spot welding. Other attachment means than spot welding (i.e., small rivets or suitable conductive adhesives or other suitable means) are alternatively used to attach the tape to the strip carrier. However, one advantage of spot welding of copper to copper is that this provides excellent electrical contact between the tape traces (which are electrically connected to the broad stripes on the tape) and the strip carrier, for ESD purposes.

In the next step for the wire bonding embodiment of the invention, the semiconductor die 40A, 40B, etc. as shown in FIG. 4 are attached by conventional means such as conductive epoxy adhesives, to the die areas 25A, 25B, etc. provided on the tape 20, with tape 20 still attached to strip carrier 10.

Next the entire assembly shown in FIG. 4 is put into an oven for conventional heat curing of the epoxy adhesive At this point, one of the advantages of the strip carrier 10 comes into play, since the tape 20 (which typically is supplied on reels) tends to curl up and if this happens, thus cause the die 40A, 40B, etc. to pop off in the prior art curing process. The strip carrier 10 keeps the tape 20 substantially flat and prevents die from popping off.

The next step is wire bonding of the contact pads (not shown) on the die 40A, 40B, etc. to the traces on the tape 20. Conventional wire bonding equipment and methods are used, as in the conventional wire bonding of die to lead frames. The wire bonds are shown for example at 26.

Since the strip carrier 10 is capable of being attached to tape 20 of a range of widths, the strip carrier allows one conventional bonding machine to be set up to handle one width of strip carrier 10 to wire bond a range of width of tapes 20 to the die 40A, 40B, etc. This is a significant improvement over the prior art wire bonding process, in which different lead frame widths require a different set up of the wire bonding machine.

The present invention therefore in contrast to the prior art allows a wire bonding machine to process a range of packages having different lead counts, since the strip carrier is the part of the structure that the wire bonding equipment is set up to process.

After bonding, the next step is packaging each die 40A, 40B, etc. The present invention is compatible with both conventional transfer molding packaging and conventional premolded packaging. In transfer molding, the typically plastic package is molded from molten plastic directly over the die. In premolded packaging, the package is molded separately and applied to the die, then sealed around the die with liquid epoxy. Both molding methods are well known in the prior art. In accordance with the present invention, the molded package (however molded) is applied to the die while the die is still on the strip carrier 10. The die after being packaged are shown in FIG. 5, on strip carrier 10 and tape 20, with plastic molded packages 50A, 50B, etc. covering the die (not shown) and wire bonds and all but the ends of the traces 23A, 23B.

The next step is solder plating of the exposed traces 23A, 23B, etc. on the tape 20, which is still welded to the strip carrier 10. In accordance with the present invention, the enhanced rigidity of the tape 20 in the method of the present invention due to the tape 20 being attached to the strip carrier 10, allows plating of the traces 23A, 23B, etc. after packaging. This plating after packaging keeps the plating process from harming the die.

This plating is accomplished by first conventionally immersion plating a layer of silver about 10 μm thick over the strip carrier-tape-die assembly of FIG. 5. The silver selectively plates only onto the copper of the strip carrier 10 and not onto the gold which is on the tape traces. Then a layer of nickel about 40 μm to about 100 μm is electroplated over all exposed conductive elements of the assembly. Thus the copper strip carrier 10 has a layer of silver on top of which is a layer of nickel and the exposed traces of the tape 10 have the nickel layer over gold. The purpose of these two layers (silver and nickel) is later to permit removal of solder plating from the strip carrier 10, as described above.

After the silver and nickel plating, next the entire assembly is solder electro-plated by conventional methods. The purpose of solder plating is to solder plate the outer exposed ends of the traces 23A, 23B, etc. on the tape 20, so the leads 23A, 23B, etc. can be easily soldered by the user as described above. Since the entire assembly is exposed to these plating steps, each of which includes corrosive plating baths, the die packages 50A, 50B, etc. must be properly sealed and robust enough to completely protect the die from exposure to the plating baths.

An alternate method is to strip the gold layer from the tape before silver plating, then plate the silver, and then plate the solder.

Next, the packaged die and their surrounding tape areas are excised (i.e., cut) from the strip carrier by conventional TAB excising equipment. The rectangular cutouts 12A, 12B, etc. (see FIG. 1) in the strip carrier 10 (as described above) are large enough so that the excising blades do not touch the strip carrier 10, but only cut through the tape 20 in FIG. 5. A clearance of approximately 0.030 inch (0.76 mm) is sufficient between the edge of each rectangular cut-out and the excising blade. The excising equipment clamps to the edge of the strip carrier 10 so as to steady it during the excising operation.

Figure 6:
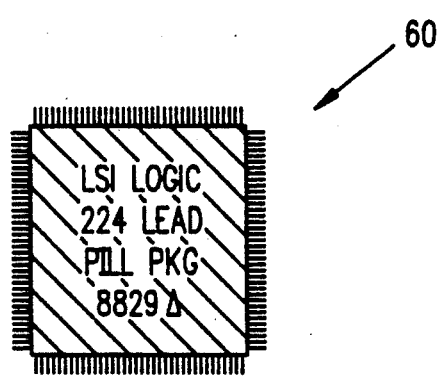
FIG. 6 shows an excised packaged die.

At this point each excised packaged die and tape unit 60 as shown in FIG. 6 is an integrated circuit and is further processed conventionally. Each packaged die 60 is preferably placed in a conventional slide carrier (not shown). The completed integrated circuit 60 in the slide carrier is then subjected to conventional final testing. The integrated circuit, if it passes the tests, is removed from the slide carrier prior to conventionally mounting on a printed circuit board.

The strip carrier 10 as shown in FIG. 7, which still has part of the tape 20 spot welded to it and has been plated, can be reused. By conventional means, the solder plating, nickel plating, and silver plating are stripped off. The silver plating layer allows easy stripping by means of abrasion since silver does not form a strong electrochemical bond to copper. The remaining pieces of tape 20 are removed from strip carrier 10 by peeling, with any burrs being removed along with the silver.

Then the strip carrier 10 is reused for another integrated circuit lead bonding and packaging cycle as described above.

Figure 8:
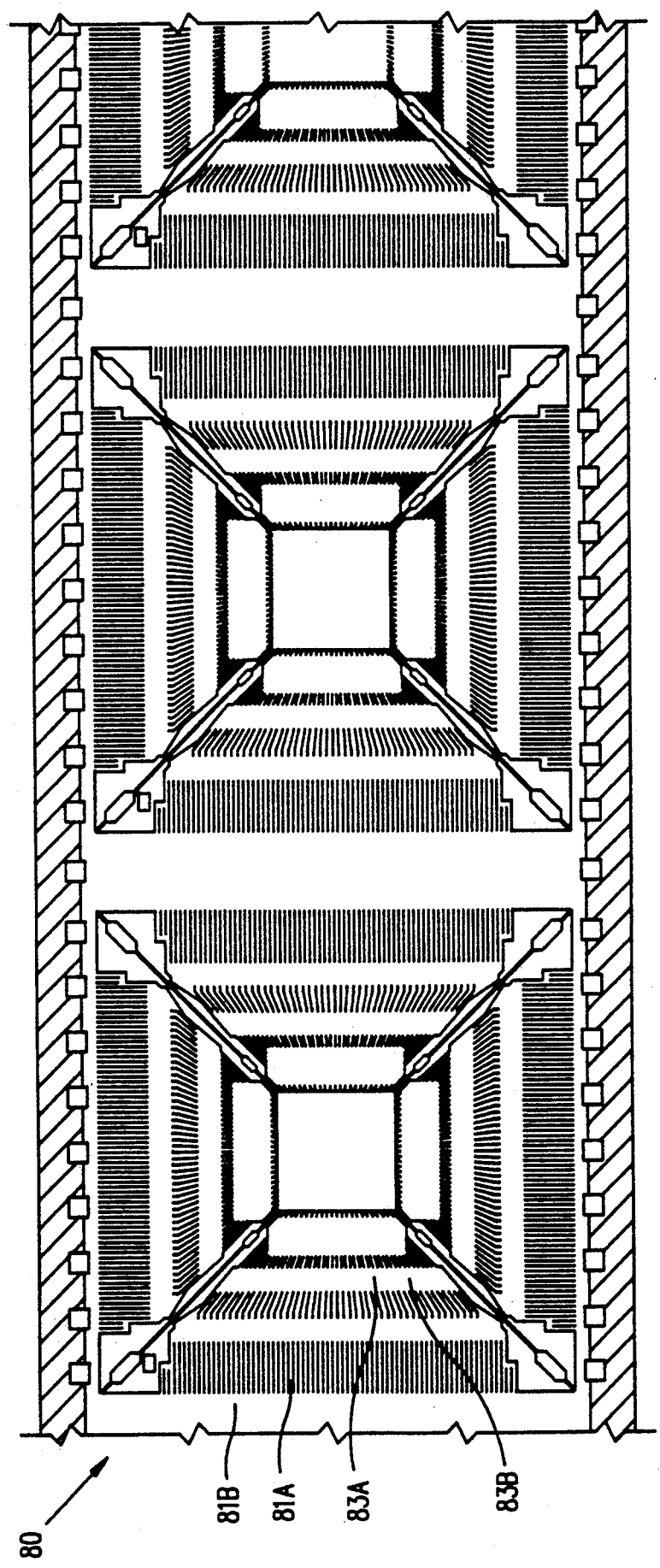
FIG. 8 shows the tape in an alternate embodiment of the invention.

One alternate embodiment of the invention as shown in FIG. 8 employs special TAB tape 80 in which the outer portion 81A, 81B of each trace is unplated copper only, and the inner portion 83A, 83B is conventional gold plated over copper. Then in the plating process, the nickel plating step is eliminated, since there would not be any need to cover the gold on the traces. This is because the exposed gold is the cause of undesirable solder embrittlement.

Another alternate embodiment of the invention (not shown) uses the well known type of TAB bonding described above in which a "bump" contact pad on the die lines up with a gold contact finger on the tape (i.e., "finger-to-bump bonding"). In this type of bonding, there is no die attachment step, since the gold finger to bump bonding both bonds the tape leads to the die and bonds the die to the tape.

The strip carrier is used with this conventional TAB bonding method by employing the following steps:

1. Spot welding the tape to the strip carrier as described above;

2. Attaching die by means of gold plated die bond pads to gold plated finger leads on the tape conventionally in one step by TAB bonding; and 3. Assembling the package on each die as described above, and proceeding as in the above described embodiment for the remaining steps.

In yet another embodiment, instead of spot welding a long strip of tape to a strip carrier, only a short strip long enough for just one die, is spot welded to the strip carrier. Thus the curling tendency of the tape during later processing is reduced even further, so as to further ensure that the tape remains flat.

The above described embodiments are illustrative and not limiting. Further embodiments will be obvious to one of ordinary skill in the art in the light of the above description.

We claim:

1. A process for bonding a semiconductor die to a tape having leads comprising the steps of:
   providing a strip carrier which is a rigid flat metal plate;
   attaching the tape to the strip carrier; and
   bonding the die to the tape leads.

2. The process of claim 1, wherein the step of attaching the tape comprises the step of affixing a metal area on the tape to a metal area on the strip carrier.

3. The process of claim 1, wherein the step of attaching comprises spot welding the tape to the strip carrier.

4. The process of claim 1, further comprising the step, after the step of attaching the tape, of attaching the die to the tape.

5. The process of claim 1, further comprising the step, after the step of bonding the die, of encapsulating the die in a package.

6. The process of claim 5, further comprising the step, after the step of encapsulating the package, of curing the package.

7. The process of claim 6, further comprising the step, after the step of curing the package, of plating solder on the tape leads.

8. The process of claim 7, further comprising the step, after the step of plating solder, of excising the die from the strip carrier.

9. The process of claim 1, wherein the strip carrier substantially comprises copper.

10. The process of claim 2, wherein the strip carrier is rectangular in shape and the tape is affixed to the die at two opposing sides of the strip carrier.

11. The process of claim 2, wherein the tape includes at least two attachment areas formed of conductive material on the tape, and the tape is affixed to the strip carrier at the attachment areas.

12. The process of claim 1, wherein the strip carrier includes alignment holes along at least one side.

13. The process of claim 1, wherein the bonding step comprises tape automated bonding.

14. The process of claim 1, wherein the bonding step comprises wire bonding.

15. The process of claim 1, wherein the bonding step comprises finger-to-bump tape automated bonding.

16. The process of claim 1, wherein the step of bonding the die to the tape leads comprises attaching the die to the tape.

17. The process of claim 1, further comprising the step of bonding a plurality of die to the tape leads.

18. The process of claim 1, wherein the strip carrier means is of a size so as to fit into a semiconductor processing magazine.

19. The process of claim 1, wherein the strip carrier means includes at last one cut-out section.

20. The process of claim 1, wherein the strip carrier means has a width in the range of about 45 mm to about 115 mm.

21. The process of claim 1, wherein the strip carrier means has a thickness of about 0.1 mm to about 0.4 mm.

22. The process of claim 1, wherein the strip carrier has as small a thickness as possible while maintaining mechanical rigidity.

23. The process of claim 8, further comprising the step, after the step of excising, of removing the solder plating and tape from the strip carrier so as to render the strip carrier reusable.

24. The process of claim 7, further comprising the steps, before the step of solder plating, of:
   plating silver on the strip carrier; and
   plating nickel on the plate silver.

25. The process of claim 1, wherein the inner portions of the leads are gold plated.

26. The process of claim 4, wherein a strip carrier having a particular width is capable of having tapes having a plurality of widths attached to the strip carrier.

27. A process for bonding a semiconductor die to a tape having leads comprising the steps of:
   attaching the tape to a rigid member;
   bonding the die to the tape leads;
   forming a package on the die;
   plating solder on the tape leads and rigid member;
   excising the die from the rigid member; and
   removing the solder plating and tape from the rigid member so as to render the rigid member reusable.

28. A process for bonding a semiconductor die to a tape having leads comprising the steps of:
   attaching the tape to a rigid member;
   bonding the die to the tape leads;
   forming a package on the die;
   plating silver on the rigid member;
   plating nickel on the plated silver; and
   plating solder on the tape leads.

* * * * *